United States Patent
Lin

(10) Patent No.: US 11,417,615 B2
(45) Date of Patent: Aug. 16, 2022

(54) TRANSITION CIRCUITRY FOR INTEGRATED CIRCUIT DIE

(71) Applicant: ANALOG DEVICES, INC., Norwood, MA (US)

(72) Inventor: Song Lin, Burlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/282,170

(22) Filed: Feb. 21, 2019

(65) Prior Publication Data

US 2020/0168567 A1    May 28, 2020

Related U.S. Application Data

(60) Provisional application No. 62/772,013, filed on Nov. 27, 2018.

(51) Int. Cl.
| | | |
|---|---|---|
| *H01L 23/66* | (2006.01) | |
| *H01P 3/08* | (2006.01) | |
| *H01P 3/00* | (2006.01) | |

(52) U.S. Cl.
CPC .............. *H01L 23/66* (2013.01); *H01P 3/003* (2013.01); *H01P 3/081* (2013.01); *H01L 2223/6616* (2013.01); *H01L 2223/6627* (2013.01)

(58) Field of Classification Search
CPC ............. H01L 23/66; H01L 2223/6616; H01L 2223/6627; H01P 3/003; H01P 3/081
See application file for complete search history.

(56) References Cited

U.S. PATENT DOCUMENTS

| | | | |
|---|---|---|---|
| 4,841,101 A | 6/1989 | Pollock | |
| 5,223,672 A | 6/1993 | Pinneo et al. | |
| 5,432,482 A * | 7/1995 | Bailey | H03B 9/147 331/172 |
| 5,523,622 A | 6/1996 | Harada et al. | |
| 5,760,650 A * | 6/1998 | Faulkner | H03F 3/605 330/286 |
| 5,819,401 A | 10/1998 | Johannes et al. | |
| 5,994,975 A | 11/1999 | Allen et al. | |
| (Continued) | | | |

FOREIGN PATENT DOCUMENTS

DE    20 2014 104 574 U    11/2014

OTHER PUBLICATIONS

U.S. Appl. No. 16/282,148, filed Feb. 21, 2019, Mahon et al.
(Continued)

*Primary Examiner* — Peter Bradford
(74) *Attorney, Agent, or Firm* — Knobbe Martens Olson & Bear LLP

(57) ABSTRACT

An integrated circuit (IC) die having a first side and a second side opposite the first side is disclosed. The IC die can include a signal via through the IC die. The IC die can include processing circuitry. The IC die can include transition circuitry providing electrical communication between the processing circuitry and the signal via. The transition circuitry can comprise a first transmission line, a second transmission line, and a transition transmission line between the first and second transmission lines. In various embodiments, the first transmission line can comprise a microstrip (MS) line, and the second transmission line can comprise a grounded coplanar waveguide (CPW).

14 Claims, 11 Drawing Sheets

(56) References Cited

U.S. PATENT DOCUMENTS

| | | | |
|---|---|---|---|
| 6,111,198 A | 8/2000 | Tower | |
| 6,423,575 B1 | 7/2002 | Tran et al. | |
| 6,455,880 B1* | 9/2002 | Ono | H01L 23/66 |
| | | | 257/275 |
| 6,514,783 B1* | 2/2003 | Welstand | H01L 23/66 |
| | | | 257/E21.511 |
| 6,680,544 B2 | 1/2004 | Lu et al. | |
| 6,841,731 B1 | 1/2005 | Zanello | |
| 6,844,502 B2 | 1/2005 | Deng et al. | |
| 6,900,533 B2 | 5/2005 | Burton | |
| 7,444,734 B2 | 11/2008 | Gaucher et al. | |
| 7,732,913 B2 | 9/2010 | Hsieh et al. | |
| 7,968,978 B2 | 6/2011 | Adlerstein et al. | |
| 8,119,931 B1 | 2/2012 | Liu | |
| 8,153,449 B2 | 4/2012 | Adlerstein et al. | |
| 8,618,629 B2 | 12/2013 | Kim et al. | |
| 8,773,204 B2* | 7/2014 | Cabanillas | H03F 1/347 |
| | | | 330/283 |
| 9,048,232 B2 | 6/2015 | Colussi et al. | |
| 9,059,490 B2 | 6/2015 | DeVries et al. | |
| 9,245,835 B1* | 1/2016 | Jiang | H01L 21/76895 |
| 9,318,450 B1* | 4/2016 | Reza | H01L 23/535 |
| 9,437,558 B2 | 9/2016 | Pye et al. | |
| 9,577,416 B2 | 2/2017 | Nisslbeck et al. | |
| 9,666,544 B2 | 5/2017 | Zu et al. | |
| 9,711,465 B2 | 7/2017 | Liao et al. | |
| 9,812,379 B1 | 11/2017 | Chiu et al. | |
| 9,978,698 B1* | 5/2018 | Trulli | H01L 24/24 |
| 10,325,742 B2* | 6/2019 | Koul | H01P 1/127 |
| 10,945,337 B2 | 3/2021 | Ikeda et al. | |
| 2003/0080822 A1* | 5/2003 | Tzsuang | H01P 5/107 |
| | | | 333/21 R |
| 2004/0173370 A1* | 9/2004 | Deng | H01B 17/30 |
| | | | 174/50.5 |
| 2008/0100394 A1* | 5/2008 | Margomenos | H01P 1/047 |
| | | | 333/32 |
| 2009/0057872 A1* | 3/2009 | Ehlers | H01L 24/06 |
| | | | 257/698 |
| 2009/0102740 A1* | 4/2009 | Rofougaran | H01L 25/0657 |
| | | | 343/860 |
| 2010/0200968 A1* | 8/2010 | Purden | H01L 23/49838 |
| | | | 257/664 |
| 2010/0232480 A1 | 9/2010 | Bhandal et al. | |
| 2010/0321129 A1* | 12/2010 | Onody | H03F 1/56 |
| | | | 333/124 |
| 2011/0084358 A1 | 4/2011 | Kim et al. | |
| 2011/0223692 A1 | 9/2011 | Adlerstein et al. | |
| 2012/0062332 A1* | 3/2012 | Nagai | H01P 1/2039 |
| | | | 333/32 |
| 2012/0193771 A1* | 8/2012 | Masuda | H03F 3/602 |
| | | | 257/664 |
| 2013/0015467 A1* | 1/2013 | Krumbein | H01L 25/165 |
| | | | 257/77 |
| 2013/0256849 A1* | 10/2013 | Danny | H01L 23/66 |
| | | | 257/664 |
| 2013/0256850 A1* | 10/2013 | Danny | H01L 23/66 |
| | | | 257/664 |
| 2014/0118084 A1* | 5/2014 | Takemura | H03H 9/0576 |
| | | | 333/133 |
| 2014/0300003 A1* | 10/2014 | Kariyazaki | H01L 23/49822 |
| | | | 257/774 |
| 2015/0042417 A1* | 2/2015 | Onodera | H03H 9/6479 |
| | | | 333/195 |
| 2015/0097633 A1* | 4/2015 | DeVries | H01P 3/003 |
| | | | 333/33 |
| 2015/0244410 A1* | 8/2015 | Leong | H01L 21/76898 |
| | | | 455/73 |
| 2016/0064792 A1* | 3/2016 | Qiang | G01S 7/03 |
| | | | 342/175 |
| 2016/0126920 A1* | 5/2016 | Kaper | H03F 3/245 |
| | | | 333/32 |
| 2016/0181211 A1 | 6/2016 | Kamgaing et al. | |
| 2016/0343653 A1 | 11/2016 | Huang et al. | |
| 2016/0344084 A1* | 11/2016 | Ghassemi | H01P 3/006 |
| 2017/0048969 A1* | 2/2017 | Qiang | H05K 1/09 |
| 2017/0077896 A1* | 3/2017 | Sugaya | H03H 7/38 |
| 2017/0111078 A1* | 4/2017 | Onodera | H03H 9/64 |
| 2017/0179050 A1* | 6/2017 | Kariyazaki | H01L 23/66 |
| 2017/0268827 A1 | 9/2017 | Kaminski et al. | |
| 2018/0012834 A1* | 1/2018 | Wang | H05K 1/0231 |
| 2018/0034421 A1 | 2/2018 | Abdo et al. | |
| 2018/0122747 A1* | 5/2018 | Sun | H01L 25/16 |
| 2018/0358675 A1* | 12/2018 | Laighton | H01P 3/006 |
| 2019/0267361 A1* | 8/2019 | Rahim | H01L 24/94 |
| 2019/0295966 A1 | 9/2019 | Kong | |
| 2019/0371746 A1 | 12/2019 | Mahon et al. | |
| 2019/0371747 A1 | 12/2019 | Wilcox | |
| 2020/0375049 A1 | 11/2020 | Winter et al. | |

OTHER PUBLICATIONS

U.S. Appl. No. 16/282,170, filed Feb. 21, 2019, Lin.

Extended European Search Report issued in application No. 19176598.1 dated Oct. 4, 2019.

Alléaume, P.F. et al., "Millimetre-wave hot-via interconnect-based GaAs chip-set for automotive RADAR and security sensors," Proceedings of the 3rd European Microwave Integrated Circuits Conference, Oct. 2008, Amsterdam, The Netherlands, pp. 52-55.

Bessemoulin, A. et al., "A chip-scale packaged amplifier MMIC using broadband hot-via-transitions," 11th GAAS Symposium, Munich 2003, pp. 415-418.

Bessemoulin, A., "Design data for hot-via interconnects in chip scale packaged MMICs up to 110 GHz," 12th GAAS Symposium, Amsterdam 2004, pp. 495-498.

Bessemoulin, A. et al., "Hot-via interconnects: A step toward surface mount chip scale packaged MMICs up to 110 GHz," IEEE CSIC Digest, 2004, pp. 237-240.

Bessemoulin, A. et al., "Soldered hot-via E-band and W-band power amplifier MMICs for millimeter-wave chip scale packaging," IEEE, 2016, pp. 1-4.

Kazior, T.E. et al., "DBIT—Direct Backside Interconnect Technology: A manufacturable, bond wire free interconnect technology for microwave and millimeter wave MMICs," IEEE MTT-S Digest, 1997, pp. 723-726.

Lin, H.T. et al., "6 inch 0.1 um GaAs pHEMT technology for E/V/band application," CS MANTECH Conference, May 16-19, 2011, Palm Springs, CA, pp. 1-3.

Lin. S. et al., "Development of an ultra-wideband suspended stripline to shielded microstrip transition,." IEEE Microwave and Wireless Components Letters, Sep. 2011, vol. 21, No. 9. pp. 474-476.

Schmückle, F.J. et al., "40 GHz hot-via flip-chip interconnects," IEEE MTT-S Digest, 2003, pp. 1167-1170.

Zhou, J. et al., "3D heterogeneous integration technology using hot via MMIC and silicon interposer with millimeter wave application," IEEE, 2017, pp. 499-502.

Stratix 10 Devices, High Speed Signal Interface Layout Design Guideline, Intel, Nov. 11, 2016, pp. 1-88.

* cited by examiner

TRANSITION CIRCUITRY FOR INTEGRATED CIRCUIT DIE

CROSS-REFERENCE TO RELATED APPLICATIONS

This application claims priority to U.S. Provisional Patent Application No. 62/772,013, filed Nov. 27, 2018, the entire contents of which are incorporated by reference herein for all purposes.

BACKGROUND

Field

The field relates to transition circuitry for an integrated circuit (IC) die, and in particular, to transition circuitry for high frequency IC dies.

Description of the Related Art

High frequency integrated circuit (IC) dies (e.g., microwave or millimeter-wave integrated circuits, or MMICs) are often mounted to a package substrate and electrically connected to the package substrate by wire or ribbon bonds. However, the use of wire or ribbon bonds at high operating frequencies induces variable parasitic inductance and/or capacitance that may significantly limit the high frequency performance and bandwidth of the IC die. Accordingly, there remains a continuing need for improved interface of high frequency IC dies.

SUMMARY

In one embodiment, an integrated circuit (IC) die is disclosed. The IC die can include a signal via through the IC die and processing circuitry. The IC die can include transition circuitry providing electrical communication between the processing circuitry and the signal via. The transition circuitry can include a first transmission line, a second transmission line, and a transition transmission line between the first and second transmission lines.

In another embodiment, an integrated circuit (IC) die having a first side and a second side opposite the first side is disclosed. The IC die can include a signal via through the IC die and processing circuitry. The IC die can include transition circuitry providing electrical communication between the processing circuitry and the signal via. During operation of the IC die, an electric field generated by the transition circuitry can be generally parallel to a plane defined by the transition circuitry.

In another embodiment, an integrated circuit (IC) die includes a signal via through the IC die and processing circuitry. The IC die can include means for reducing electrical discontinuities between the signal via and the processing circuitry. The reducing means can include first means for transmitting electrical signals, second means for transmitting electrical signals, and means for transitioning the transmission of electrical signals between the first and second transmitting means.

DETAILED DESCRIPTION

Figure 1:
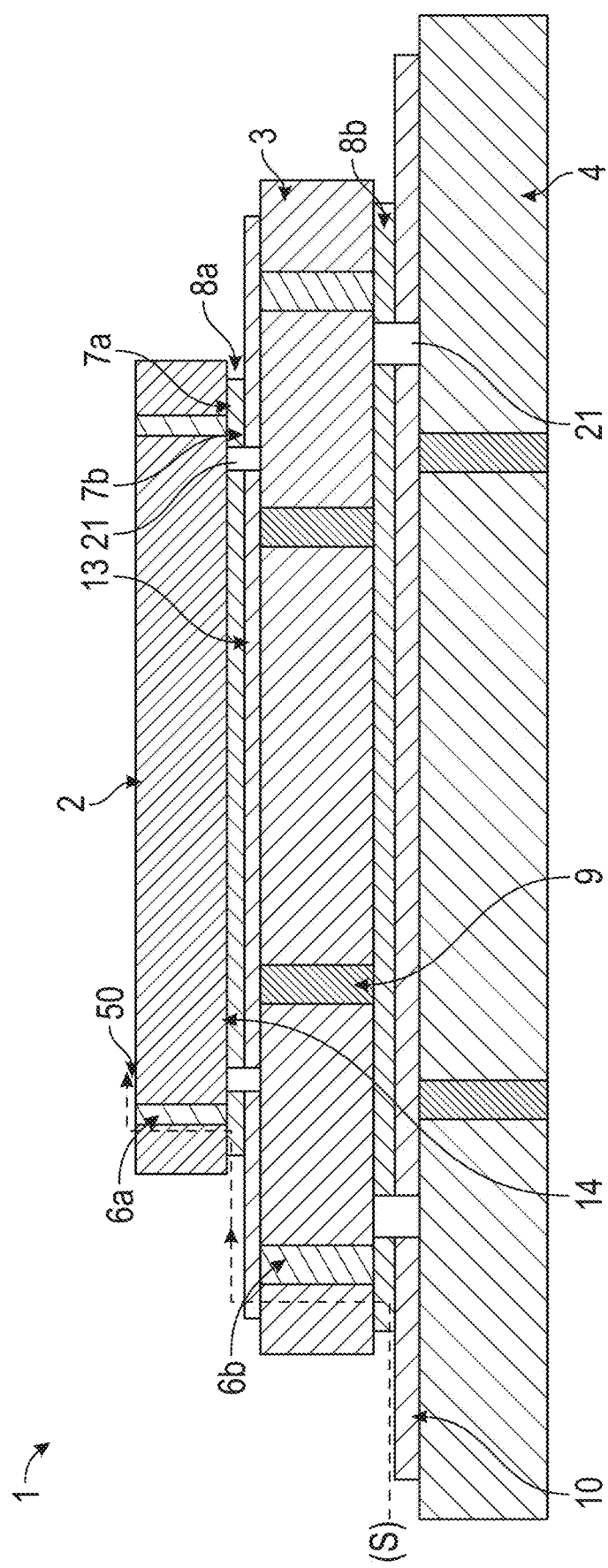
FIG. 1 is a schematic side sectional view of an integrated circuit (IC) package, according to various embodiments.

Various embodiments disclosed herein relate to high frequency IC dies and packages therefor. FIG. 1 is a schematic side sectional view of an integrated circuit (IC) package 1, according to various embodiments. The package 1 can comprise an IC die 2 mounted to a package substrate 3 by way of an adhesive 8a. The IC die 2 can comprise circuitry (e.g., transmission lines, active circuits, etc.) at or near a top side of the die 2. In other embodiments, however, active circuitry can alternatively or additionally be provided on a bottom side of the die 2, or at locations within the die 2 between the top and bottom sides. Further, the die 2 can comprise die ground metallization 14 configured to connect to the package substrate 3. In some embodiments, portions of the die ground metallization 14 can be configured to connect to electrical ground. The IC die 2 can be configured to carry radio frequency (RF) signals, including but not limited to radio frequency (RF), microwave and mm-wave signals. For example, the IC die 2 can operate at one or more frequencies in a range of 1 Hz to 200 GHz, at one or more frequencies in a range of 1 Hz to 100 GHz, at one or more frequencies in a range of 40 GHz to 200 GHz, at one or more frequencies in a range of 40 GHz to 100 GHz, or at one or more frequencies in a range of 40 GHz to 95 GHz. In various embodiments, the die 2 can comprise a monolithic microwave or millimeter-wave integrated circuit (MMIC). The die 2 can comprise a semiconductor die, including any suitable Group III-IV material. For example, the die 2 shown in FIG. 1 comprises a gallium arsenide (GaAs) die. In various embodiments, the die 2 can comprise a wideband millimeter-wave low noise amplifier (LNA) that can accommodate full V- and E-waveguide bands.

The adhesive 8a in FIG. 1 comprises an epoxy (e.g., a conductive epoxy), but any suitable adhesive can be used, such as solder. The package substrate 3 can comprise any suitable type of substrate, such as a laminate substrate (e.g., a printed circuit board, or PCB), an interposer (e.g., a semiconductor interposer with patterned metal), etc. Bond pads 7a on a bottom side of the die 2 can be electrically connected or bonded to corresponding bond pads 7b on a top side of the package substrate 3. For example, in the illustrated embodiment, the adhesive 8a can comprise a conductive material (e.g., a conductive epoxy) that can provide mechanical and electrical connection between the die 2 and the package substrate 3. In addition, the top side of the package substrate 3 can comprise metallization defining a substrate ground plane 13. As shown in FIG. 1, an insulating mask 21 (e.g., a solder mask) can be applied between the die 2 and the package substrate 3, and between the package substrate 3 and the carrier 4, to electrically separate ground metallization from signal metallization. For example, a portion of the insulating mask 21 can be disposed between the pads 7a, 7b and the ground metallization 13, 14.

The package substrate 3 can be mounted to a board or a carrier 4 by way of an adhesive 8b. The adhesive 8b may be the same as or different from the adhesive 8a, such as an epoxy (e.g., conductive epoxy), solder, etc. A feedline 10 (e.g., a radio frequency, or RF, feedline) can be formed on or connected to the carrier 4, and can convey signals to and/or from the package substrate 3. One or more package substrate signal vias 6b can be provided through the package substrate 3 to convey signals to and/or from the IC die 2. Further, the package substrate 3 can comprise one or more ground vias 9 to provide an electrical pathway to ground through the package substrate 3. Further, the IC die can comprise one or more die signal vias 6a (or hot vias) through the die 2 to convey electrical signals between the package substrate 3 and circuitry (e.g., transmission lines, active circuits, etc.) at or near the first or upper side of the die 2, which may comprise the front side of the die 2 having active circuitry. The signal or hot vias 6a can comprise through substrate vias (TSVs) that pass through the die 2.

As shown in FIG. 1, a signal pathway S can extend laterally (e.g., horizontally) along the feedline 10, vertically along the via 6b, laterally along traces or connectors (not shown) at or near the top side of the package substrate 3, vertically along the via 6a of the die, and laterally along the IC die 2. The discontinuities associated with the change of directions from vertical to lateral (or horizontal) and the geometries of the various legs create parasitics and consequent mismatches (e.g., impedance mismatches) that degrade the performance of the IC die, or may lead to excessive insertion losses. For example, the discontinuities may significantly limit the operational bandwidth of the package 1.

Accordingly, in various embodiments, transition circuitry 50 can be provided in the IC die 2. In FIG. 1, the transition circuitry 50 can be disposed within the die 2, at or near the first side of the die 2. In other embodiments, the transition circuitry 50 can be disposed at or near the second side of the die 2, or can be embedded in the die 2. In some embodiments, the transition circuitry 50 can be provided or embedded in the die 2 between the first and second sides of the die 2. The transition circuitry 50 can be patterned into the IC die 2 with any suitable shapes and dimensions that can reduce electrical discontinuity or losses that may occur at the transition between horizontal or lateral lines at the first side of the die 2 and the vertically-disposed signal via 6a. The pattern of the transition circuitry 50 can also be suitably designed to compensate for other discontinuities and mismatches, e.g., between the die 2 and the package substrate 3, and/or between the package substrate 3 and the carrier. In some embodiments, for example, transition circuitry 50 can be provided within a substrate at the top of a through substrate via (TSV), or between the TSV and transmission line. In some embodiments, the substrate can comprise the semiconductor substrate of the die 2, such as what is shown in FIG. 1. In such embodiments, as described above, the transition circuitry 50 can compensate for discontinuities occurring at or near the top side of the die 2, and can reduce or eliminate electrical losses that might otherwise occur as a result of parasitics (e.g., parasitic inductance or capacitance). Further, in some embodiments, the substrate can comprise the package substrate 3. In such embodiments, the transition circuitry 50 can compensate for discontinuities occurring at or near the top side of the package substrate 3.

Figure 2:
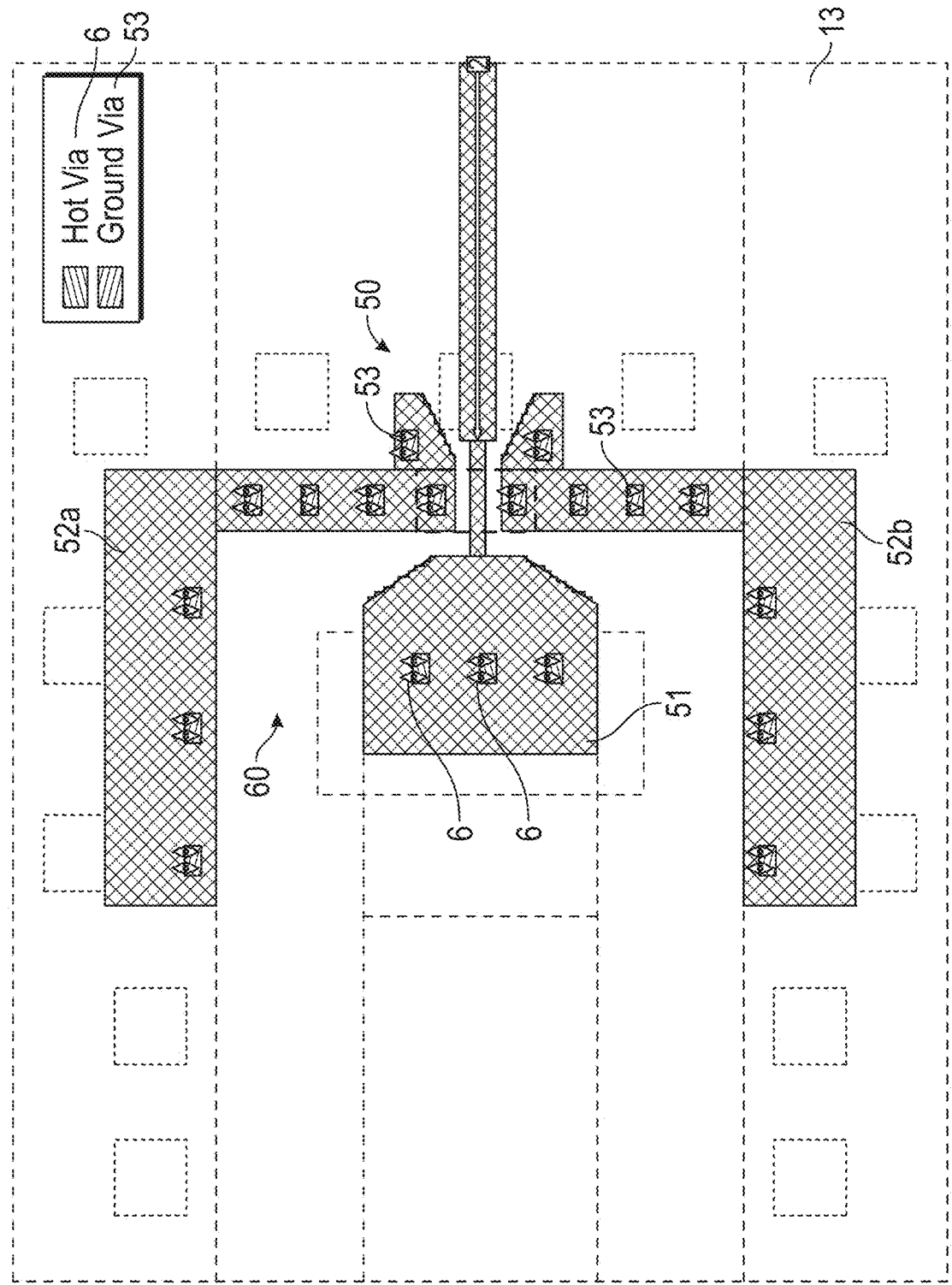
FIG. 2 is a schematic, partially transparent top view of a portion of the IC package of FIG. 1 that includes transition circuitry, according to one embodiment.
Figure 3:
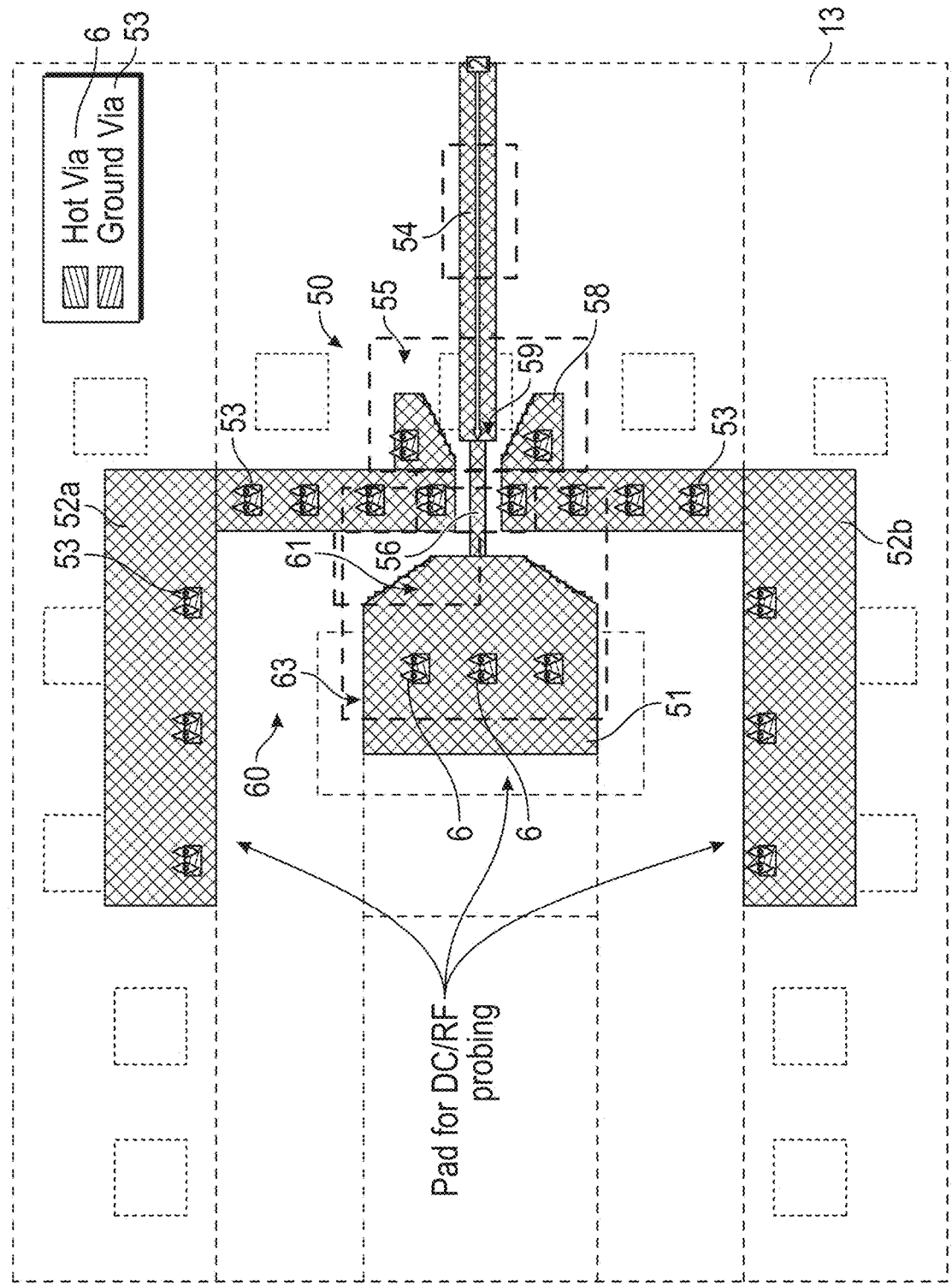
FIG. 3 is an enlarged schematic partially transparent top view of the transition circuitry shown in FIG. 2.
Figure 4:
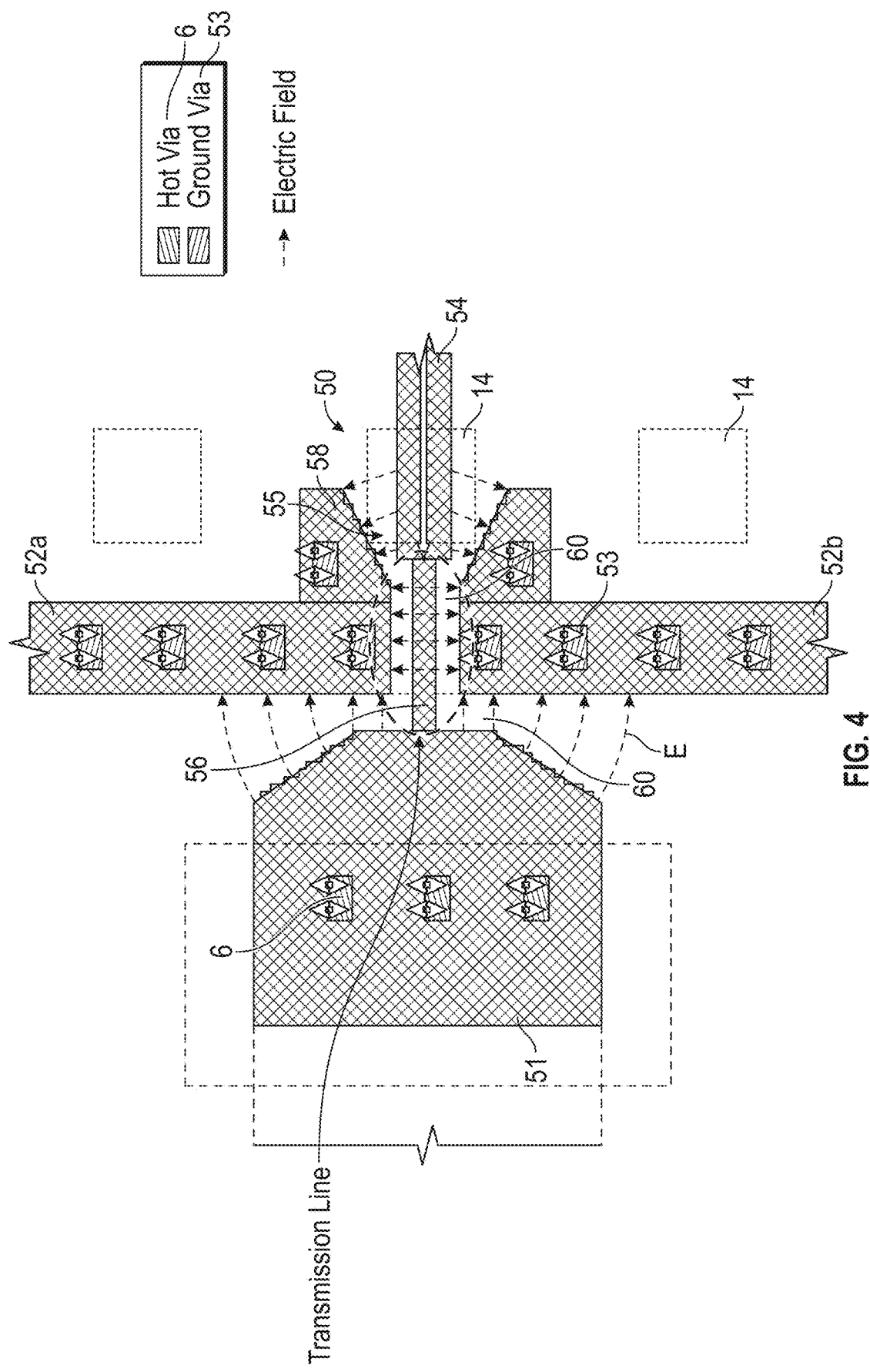
FIG. 4 is a schematic partially transparent top view of the transition circuitry of FIG. 2, shown with an electric field E similar to that generated during operation of the package.
Figure 5:
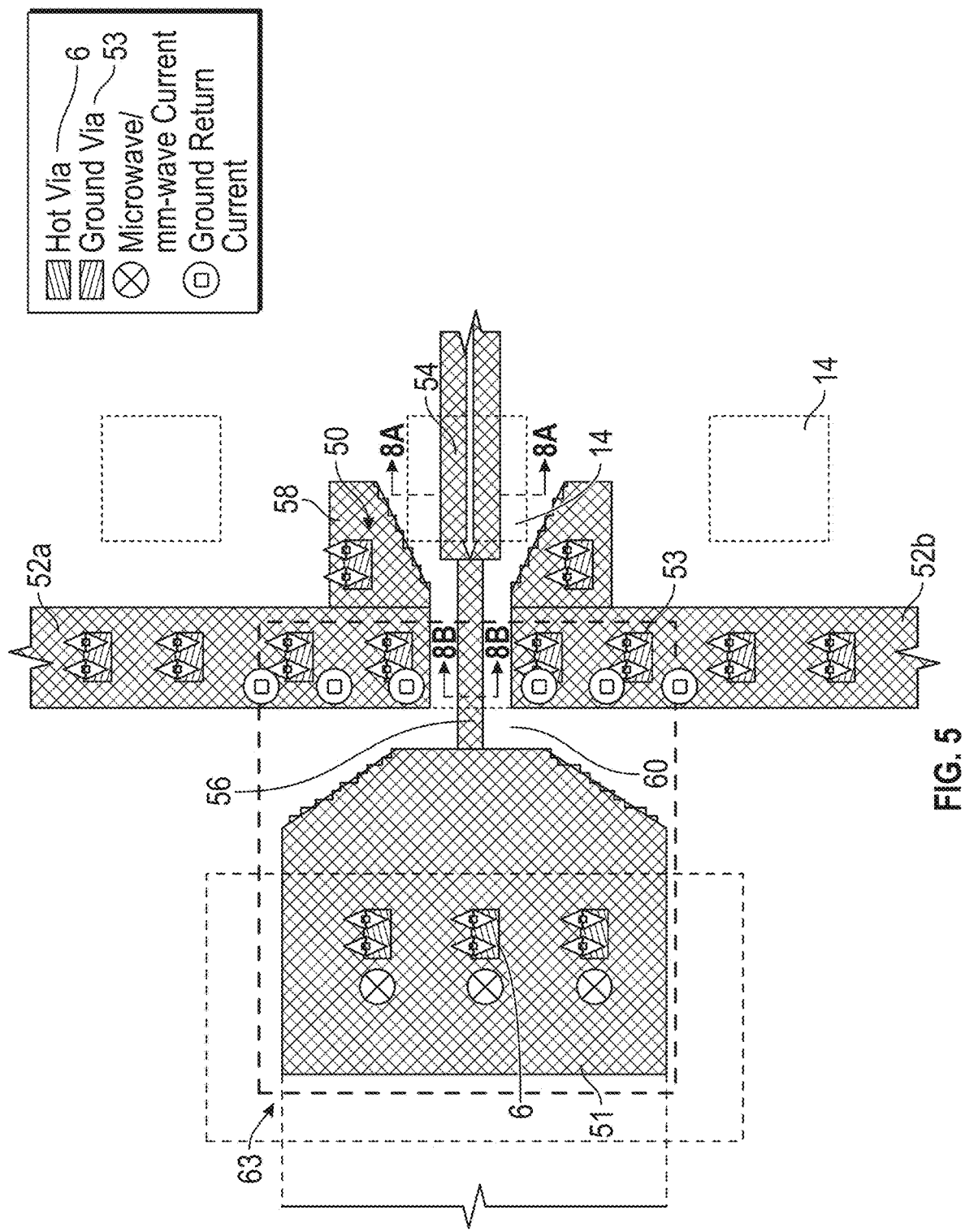
FIG. 5 is a schematic partially transparent top view of the transition circuitry of FIG. 2, illustrating an example direction of the current that passes through the IC die.
Figure 6:
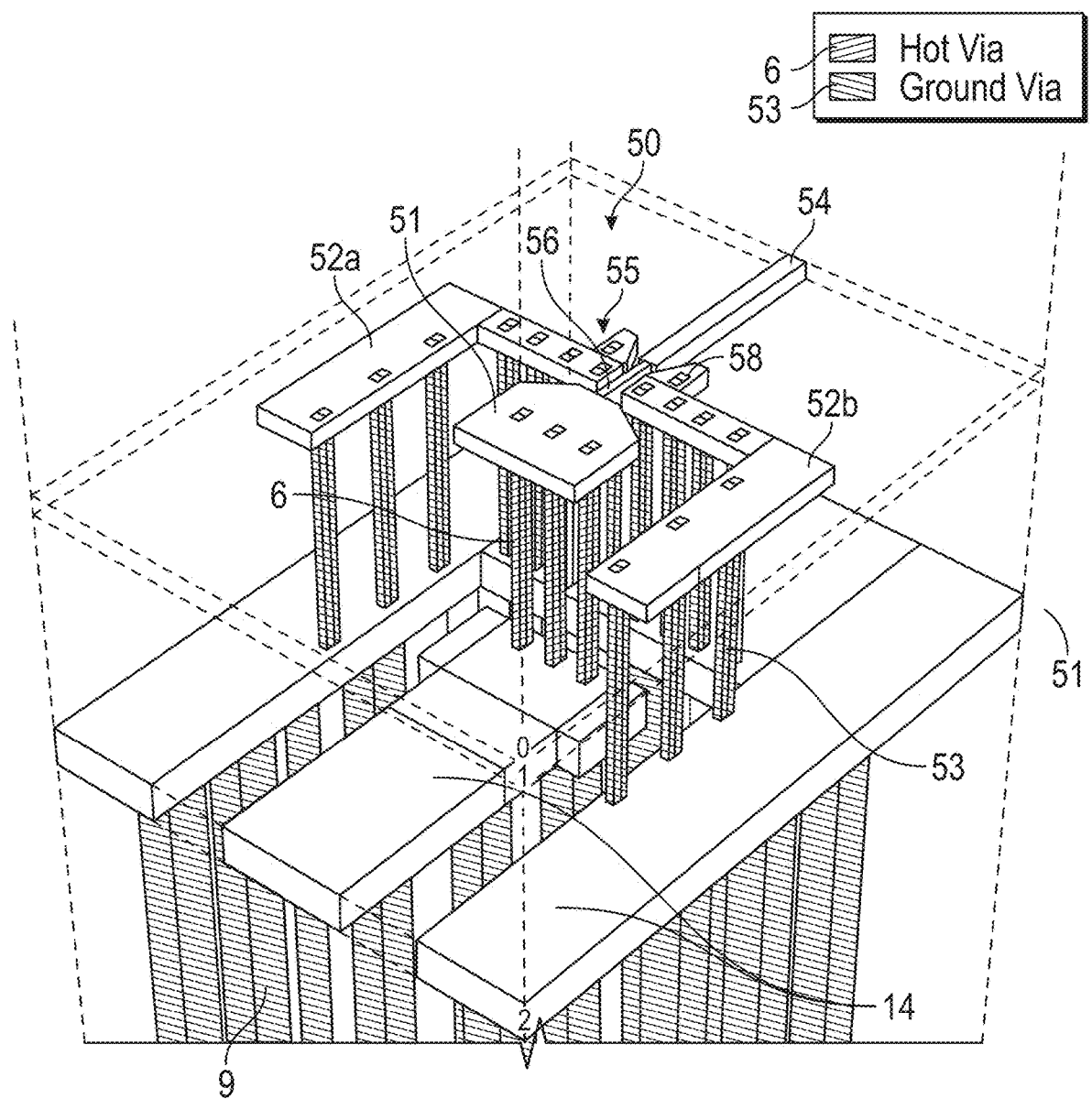
FIG. 6 is a schematic perspective view of the transition circuitry shown in FIG. 2 with the insulators omitted for purposes of illustration.

FIG. 2 is a schematic, partially transparent top view of a portion of the IC package 1 of FIG. 1 that includes transition circuitry 50, according to one embodiment. FIG. 3 is an enlarged schematic partially transparent top view of the transition circuitry 50 shown in FIG. 2. FIG. 4 is a schematic partially transparent top view of the transition circuitry 50 of FIG. 2, shown with an electric field E similar to that generated during operation of the package 1. FIG. 5 is a schematic partially transparent top view of the transition circuitry 50 of FIG. 2, illustrating an example direction of the current that passes through the IC die 2. FIG. 6 is a schematic perspective view of the transition circuitry 50 shown in FIG. 2 with the insulators omitted for purposes of illustration.

As shown in FIG. 2, the transition circuitry 50 can comprise a signal pad 51 and first and second ground pads 52a, 52b spaced from and disposed at least partially about the signal pad 51. In the illustrated embodiment, for example, the first and second ground pads 52a, 52b can be disposed about the signal pad 51 in a generally U-shaped orientation. As shown in FIGS. 2-5, a dielectric material 60 can be provided between the metallized portions (e.g., the pads 51, 52a, 52b) inside the IC die 2. One or more hot vias or signal vias 6 can extend from the top side of the die 2 from the signal pad 51 to corresponding metallization at the back or bottom side of the die 2. The hot vias or signal vias 6 can convey electrical signals through the die 2. One or more ground vias 53 can extend from the top side of the die 2 from the ground pads 52a, 52b to ground metallization 14 at the back side of the die 2 of the substrate 3.

Turning to FIGS. 3-6, the transition circuitry 50 can comprise a first transmission line 54, a second transmission line 56, a transition region 55 disposed between and electrically connecting the first and second transmission lines 54, 56, a third transmission line 63 and a transition region 61 between and electrically connecting the second and third transmission lines 56, 63. The first transmission line 54 can be electrically connected to a transmission line or other structure (not shown) in the die 2, such as to any suitable processing circuitry of the die. The second transmission line 56 can be electrically connected to the signal pad 51 and the signal via(s) 6. The third transmission line 63 can comprise the signal pad 51 and the signal vias 6. In the illustrated embodiment, the first transmission line 54 can comprise a microstrip (MS) line, and the second transmission line 56 can comprise a grounded coplanar waveguide (CPW). In the illustrated embodiment, the grounded CPW and the MS lines may not be electrically connected to ground. As shown in FIGS. 2-3, the transmission lines 54, 56 and 63 can comprise 50 ohm transmission lines, but in other embodiments, the transmission lines 54, 56 and 63 can be configured to have any other suitable impedance characteristics. Beneficially, as explained below, the first and second transmission lines 54, 56 can serve as low-loss transmission lines to transfer signals to the vias 6 while maintaining high bandwidth electrical performance.

Figure 8A:
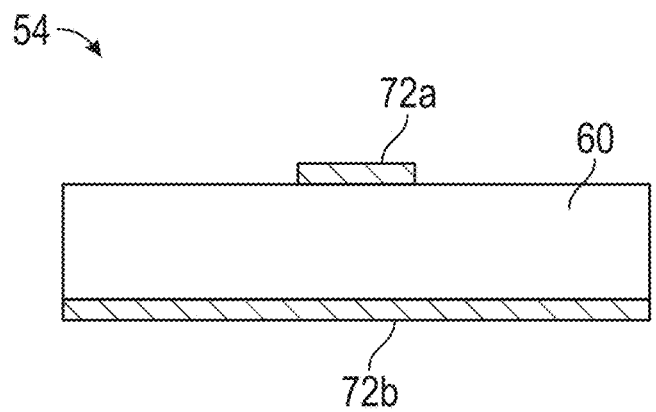
FIG. 8A is a schematic side cross-sectional view of a first transmission line, which can comprise a microstrip (MS) transmission line.
Figure 8B:
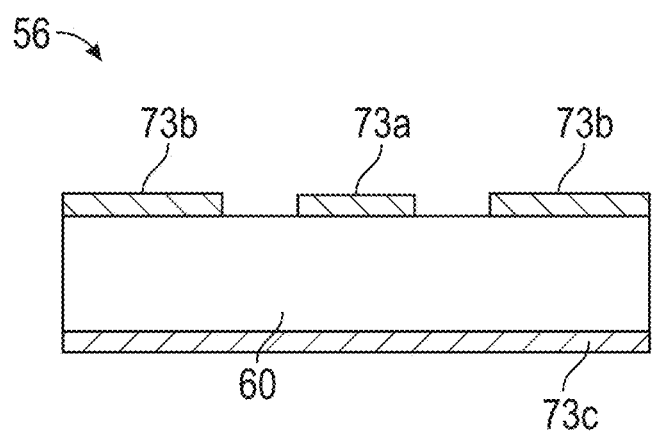
FIG. 8B is a schematic side cross-sectional view of a second transmission line, which can comprise a grounded coplanar waveguide (CPW) transmission line.

FIG. 8A is a schematic side cross-sectional view of the first transmission line 54, which as explained above, can comprise a MS transmission line. As shown in FIG. 8A, the first transmission line 54, as viewed from a side cross-section (see FIG. 5), can comprise a first conductor 72a on a first side of the line 54 and a second conductor 72b on a second side of the line 54. The dielectric material 60 can be provided between the first and second conductors 72a, 72b. As shown, the first conductor 72a can have a width less than a width of the second conductor 72b. FIG. 8B is a schematic side cross-sectional view of the second transmission line 56, which as explained above, can comprise a grounded CPW transmission line. In this embodiment, the grounded CPW can be designed such that most of the electromagnetic field is contained between the signal conductor 73a and ground conductor 73b to act as a CPW. There is a small electromagnetic field between signal conductor 73a and ground conductor 73c. The second transmission line 56 can comprise a plurality of spaced apart conductors 73a and 73b spaced apart laterally along a first side of the line 56 overlying the dielectric material 60.

Referring back to FIG. 3, the transition region 55 can provide a smooth electrical transition between the first and second transmission lines 54, 56 so as to limit electrical losses due to discontinuities or abrupt geometric changes between the first and second transmission lines 54, 56. For example, as shown in FIGS. 3-5, the transition region 55 can comprise a tapered grounded flange 58 on opposing sides of an interface 59 between the transmission lines 54, 56. At the interface 59, the first transmission line 54 (e.g., a MS) can transition to the second transmission line 56 (e.g., a grounded CPW). The grounded flange 58 can be tapered outwardly along a direction extending from the second transmission line 56 towards the first transmission line 54. The gradual taper of the grounded flange 58 may reduce the effect of the discontinuity between the transmission lines 54 and 56 so as to maintain the electrical performance of the die 2.

As shown in FIG. 4, the transition circuitry 50 can be shaped and configured such that the electric field E during operation of the die 2 is maintained generally within the plane defined by the transition circuitry 50 and the signal pad 51. For example, in some embodiments, the electric field E can be oriented generally parallel to the ground metallizations 13, 14 (FIG. 1). In some embodiments, the electric field E can be generally perpendicular to the signal via(s) 6. By confining the electric field E to the plane shown in FIG. 4, the transition circuitry 50 can provide a low loss electrical transmission pathway to the signal via(s) 6, since the planar field E generates minimal or no inductance (and hence minimal or no parasitics), even at high frequencies.

Figure 8C:
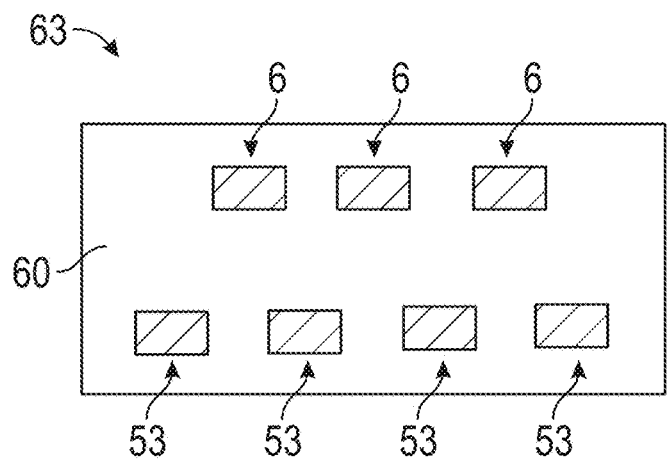
FIG. 8C is a schematic horizontal sectional view of a portion of a quasi-microstrip transmission line, with the horizontal cross-section taken below a top side of the die.

Turning to FIGS. 3, 5 and 8C, the signal vias 6 and the ground vias 53 can cooperate to serve as a quasi-microstrip transmission line 63 that extends vertically (e.g., into the page) from the first or top side of the IC die 2 to a second or bottom side of the IC die 2. A second transition region 61 (e.g., a grounded CPW-to-quasi-microstrip line transition region) can be provided as a smooth electrical transition between the grounded CPW line (e.g., the second transmission line 56) and the vertically-oriented quasi-microstrip transmission line 63. FIG. 8C is a schematic horizontal sectional view of a portion of the quasi-microstrip transmission line 63, with the horizontal cross-section taken below the top side of the die 2 (e.g., below the signal pad 51). As shown in FIGS. 5 and 8C, the current passing through the signal via(s) 6 connected to the signal pad 51 can be paired with a ground return path defined by the ground vias 53 connected to the ground pads 52a, 52b. The paired pathways can beneficially absorb any parasitic effects of through-via inductance into the quasi-microstrip line 63. The second transition region 61 can comprise outwardly angled surfaces on the signal pad 51 in order to provide the smooth electrical transition from the second transmission line 56 to the quasi-microstrip transmission line 63.

Figure 7:
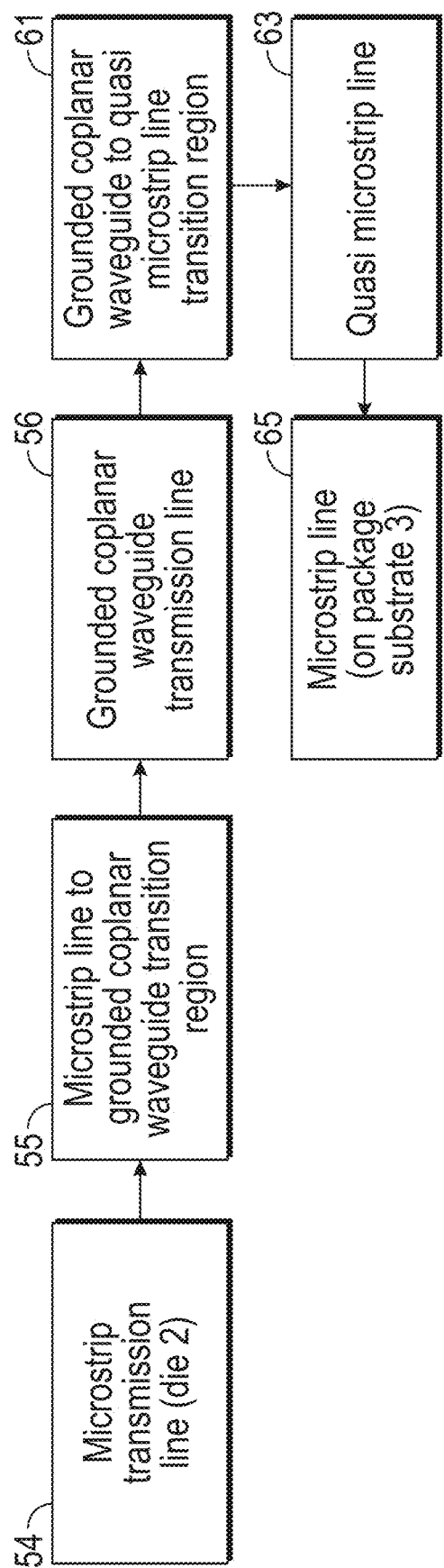
FIG. 7 is a schematic system block diagram showing the components of the package of FIG. 1.

FIG. 7 is a schematic system block diagram showing the components of the package 1 described above. As explained herein, the first transmission line 54 (e.g., MS line) can connect to other circuitry on the die 2, and can convey electrical signals to the transition region 55 and the second transmission line 56 (e.g., grounded CPW). The second transition region 61 can include the signal pad 51, which can be patterned to define an electrical transition between the second transmission line 56 and the quasi-microstrip line 63. Signals can be conveyed from the quasi-microstrip line 63 to other microstrip lines on the package substrate 3. In various embodiments disclosed herein, the transition circuitry 50 can be used in connection with semiconductor devices or dies, such as the IC die 2 described herein, including silicon-based (Si) semiconductor materials, germanium-based (Ge) semiconductor materials, Si—Ge semiconductor materials, or any other Group III-IV materials. In some embodiments, the transition circuitry 50 can be used with other material sets and applications, such as printed circuit board (PCB) substrates, ceramic substrates, etc.

Beneficially, the embodiments described herein can provide a low loss signal transition for high frequency applications. In various embodiments, the transition circuitry 50 can provide a low loss electrical pathway for IC dies 2 configured to operate at one or more frequencies in a range of 1 Hz to 150 GHz. In various embodiments, the upper frequency range can be limited by the thickness of the substrate and not from the transition circuitry 50 such that the transition circuitry 50 can be utilized with die substrates of any suitable thickness, and therefore, with packages configured to operate at any suitable frequency. The upper frequency limitation is set by the higher order mode of transmission line 54 in the substrate 3. In various embodiments, the transition circuitry 50 can provide a low loss electrical pathway for IC dies 2 configured to operate at one or more frequencies in a range of 1 Hz to 150 GHz. In various embodiments, the transition circuitry 50 can provide a low loss electrical pathway for IC dies 2 configured to operate at a 3 dB bandwidth in a range of 90 GHz to 225 GHz, in a range of 100 GHz to 225 GHz, or in a range of 175 GHz to 225 GHz. Moreover, the performance of the circuitry 50 can be maintained even for dies 2 or substrates 3, regardless of their thicknesses.

Figure 9A:
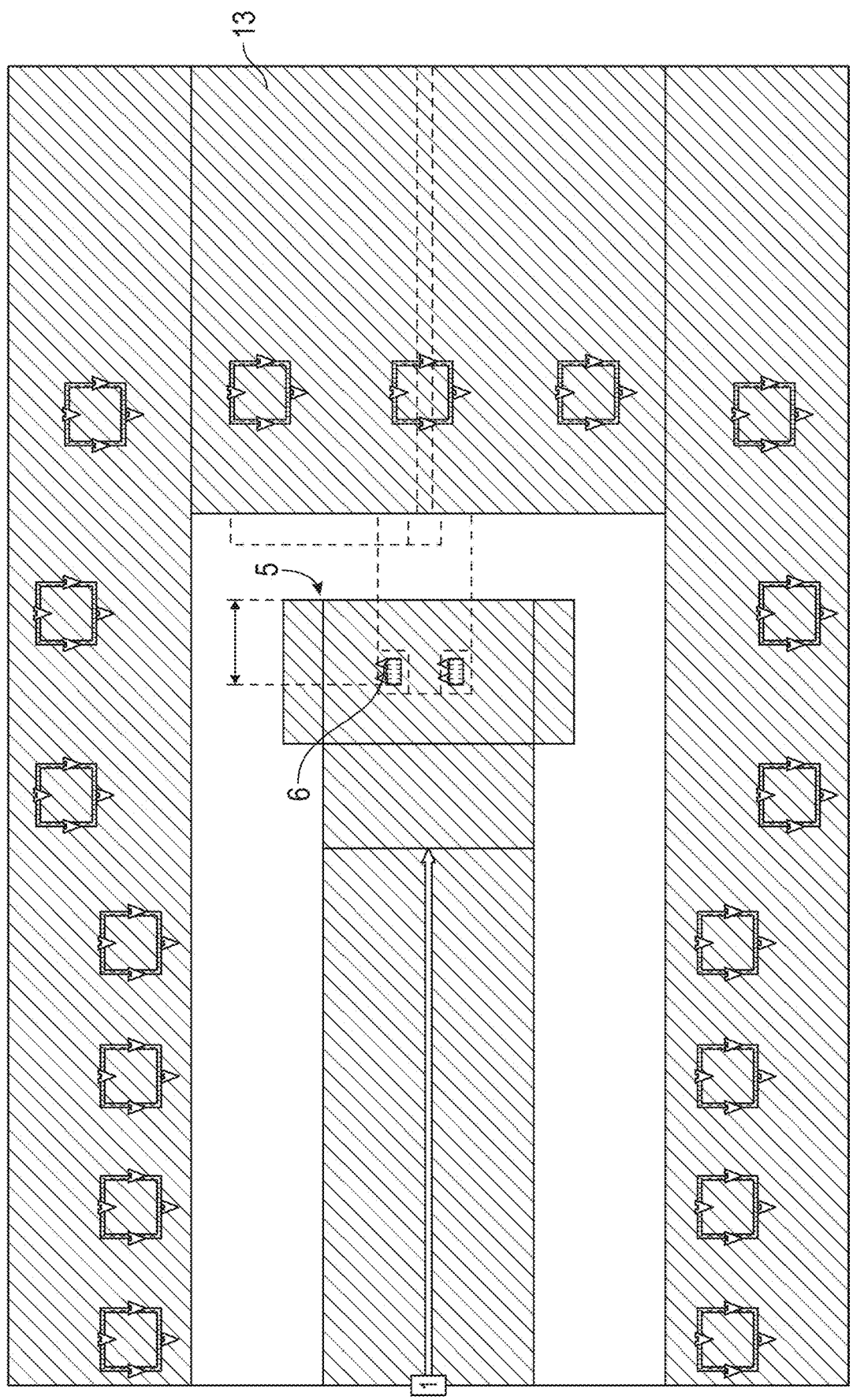
FIG. 9A is a schematic partially transparent top view of a matching circuit according to another implementation.
Figure 9B:
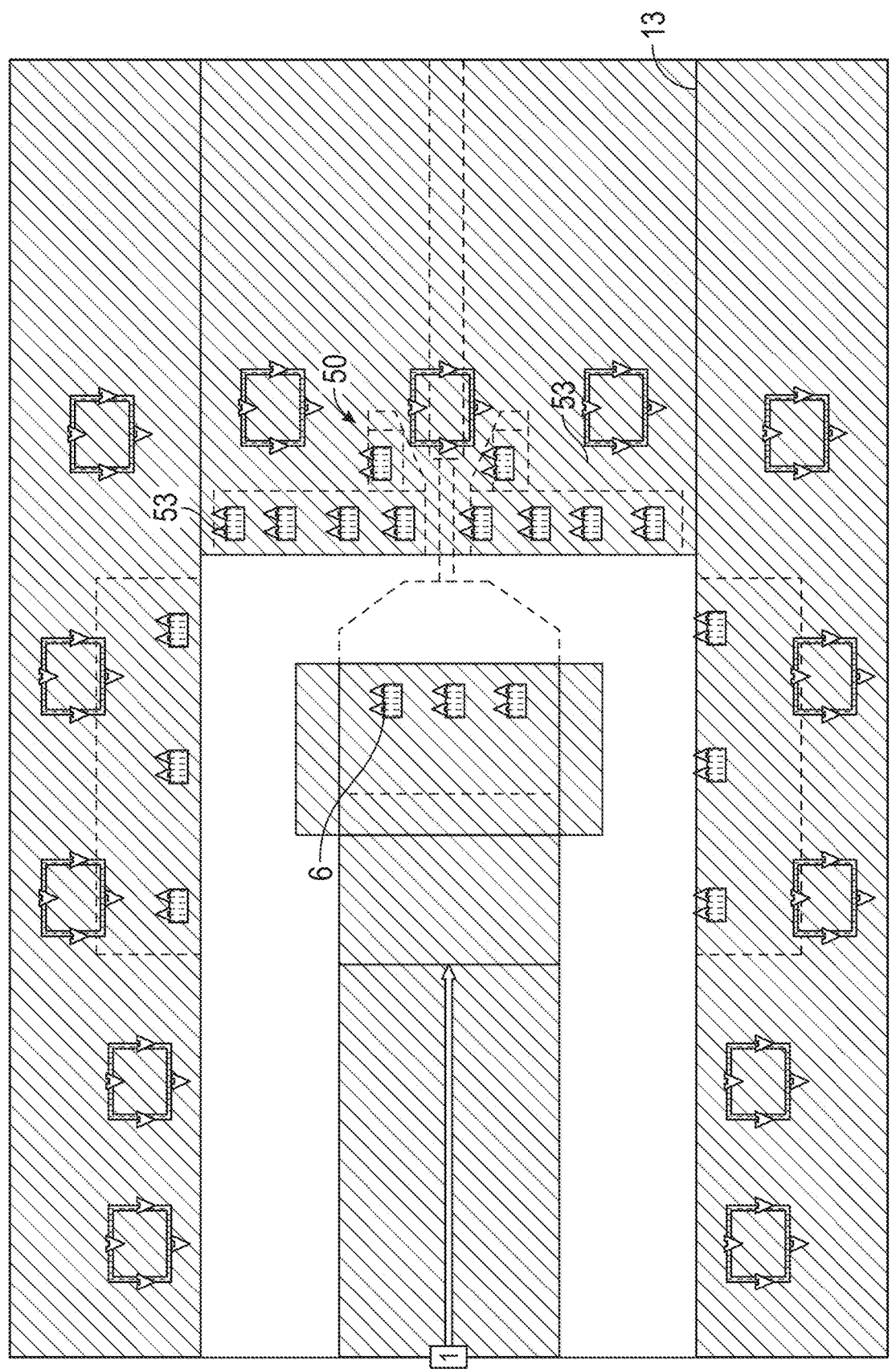
FIG. 9B is a schematic partially transparent top view of the transition circuitry described herein.
Figure 9C:
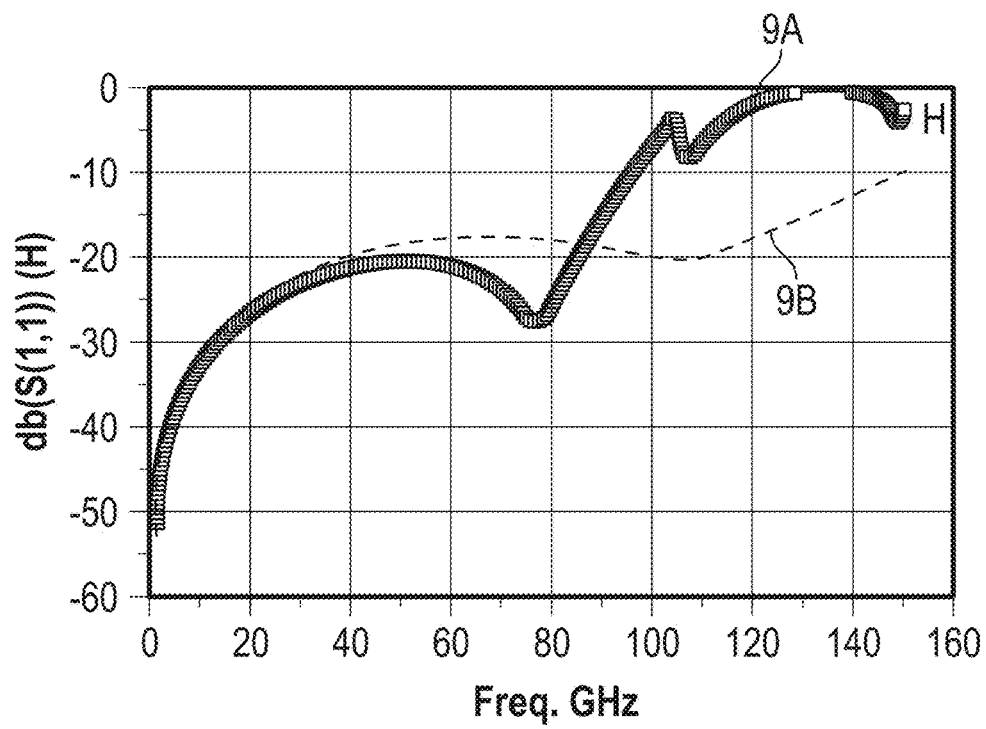
FIGS. 9C and 9D are graphs illustrating the electrical performance of the matching circuit of FIG. 9A and of the transition circuitry of FIG. 9B.
Figure 9D:
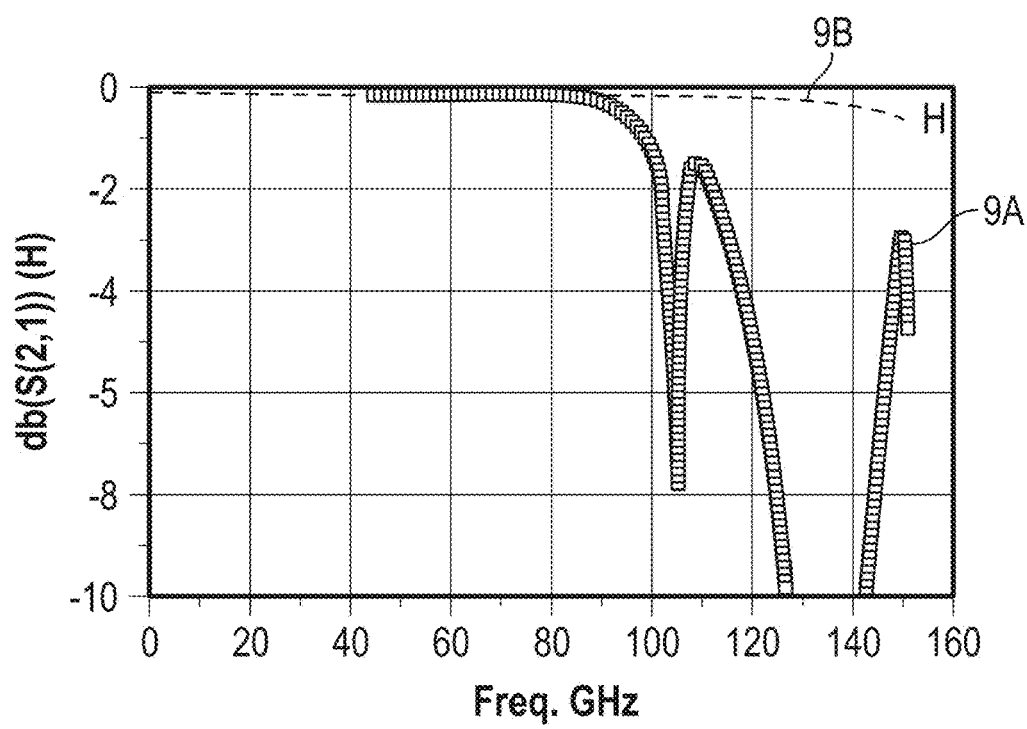

FIG. 9A is a schematic partially transparent top view of a matching circuit 5 according to another implementation. FIG. 9B is a schematic partially transparent top view of the transition circuitry 50 described herein. FIGS. 9C and 9D are graphs illustrating the electrical performance of the matching circuit 5 of FIG. 9A (labeled 9A) and of the transition circuitry 50 of FIG. 9B (labeled 9B). For example, FIG. 9C compares the return loss associated with the matching circuit 5 of FIG. 9A with the transition circuitry 50 of FIG. 9B. FIG. 9D compares the insertion loss associated with the matching circuit 5 of FIG. 9A with the transition circuitry 50 of FIG. 9B. As shown in FIGS. 9C-9D, the transition circuitry 50 of FIG. 9B can provide significantly lower insertion losses and better electrical performance at high frequencies as compared with the matching circuit 5 of FIG. 9A.

For example, in various embodiments, for a die substrate (e.g., the base substrate of die 2) having a thickness in a range of 40 μm to 60 μm (e.g., about 50 μm), the package 1 can operate at frequencies (e.g., all frequencies) at or below about 150 GHz with an insertion loss of less than 3 dB, less than 1 dB, or less than 0.6 dB. In various embodiments, for example, for die substrates having a thickness in a range of 10 μm to 30 μm (e.g., about 20 μm), the package 1 can operate at frequencies (e.g., all frequencies) at or below about 200 GHz with an insertion loss of less than 3 dB, less than 1 dB, or less than 0.6 dB. In various embodiments, the package 1 can operate at frequencies (e.g., all frequencies) at or below about 500 GHz with an insertion loss of less than 3 dB, less than 1 dB, or less than 0.6 dB.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit (IC) die comprising:
   a signal via through the IC die;
   processing circuitry; and
   transition circuitry providing electrical communication between the processing circuitry and the signal via, the transition circuitry comprising a first transmission line, a second transmission line, wherein the second transmission line comprises a grounded coplanar waveguide (CPW), and a third transmission line extending at least partially between first and second opposing sides of the IC die, the third transmission line comprising the signal via,
   wherein the first transmission line connects to the second and third transmission lines,
   wherein the transition circuitry comprises a transition region between the first and second transmission lines, the transition region comprises an interface between the first and second transmission lines, and a grounded flange spaced from the second transmission line by a dielectric material, the grounded flange tapering outwardly relative to the second transmission line,
   wherein the third transmission line comprises a signal pad connected to the signal via and a second transition region, the transition region comprising outwardly angled surfaces on the signal pad.

2. The IC die of claim 1, wherein the first transmission line comprises a microstrip (MS) transmission line.

3. The IC die of claim 2, wherein the first transmission line is connected to the processing circuitry and the second transmission line is connected to the signal via.

4. The IC die of claim 1, further comprising a signal pad and first and second ground pads spaced from the signal pad by a dielectric material, the signal via connected to the signal pad.

5. The IC die of claim 4, further comprising a plurality of ground vias electrically connecting the first and second ground pads with a ground plane of the IC die.

6. The IC die of claim 4, wherein the first and second ground pads are disposed around a portion of a periphery of the signal pad.

7. The IC die of claim 1, wherein, during operation of the IC die, the transition circuitry is configured to generate an electric field that is generally parallel to a plane defined by the transition circuitry.

8. The IC die of claim 1, wherein an impedance of the first transmission line is generally matched to an impedance of the second transmission line.

9. The IC die of claim 1, wherein the first side comprises a front active side of the IC die, and wherein the transmission line extends within the IC die laterally along the first side.

10. The IC die of claim 1, wherein the IC die is configured to operate at one or more frequencies in a range of 40 Hz to 95 GHz.

11. The IC die of claim 1, wherein the IC die is configured to operate at a 3 dB bandwidth in a range of 175 GHz to 225 GHz.

12. An integrated circuit (IC) package comprising a package substrate and the IC die of claim 1, the IC die mounted to the package substrate.

13. An integrated circuit (IC) die comprising:
    a signal via through the IC die;
    processing circuitry; and
    means for reducing electrical discontinuities between the signal via and the processing circuitry, the reducing means comprising first means for transmitting electrical signals, second means for transmitting electrical signals, third means for transmitting electrical signals, and means for transitioning the transmission of electrical signals between the first, second, and third transmitting means,
    wherein the first transmitting means connects to the second and third transmitting means,
    wherein the second transmitting means comprises a grounded coplanar waveguide (CPW),
    wherein the third transmitting means extends at least partially between first and second opposing sides of the IC die, the third transmitting means comprising the signal via,
    wherein the means for reducing electrical discontinuities between the signal via and the processing circuitry comprises a transition region between the first and second transmitting means, the transition region comprises an interface between the first and second transmitting means, and a grounded flange spaced from the second transmitting means by a dielectric material, the grounded flange tapering outwardly relative to the second transmitting means,
    wherein the third transmitting means comprises a signal pad connected to the signal via and a second transition region, the transition region comprising outwardly angled surfaces on the signal pad.

14. The IC die of claim 13, wherein the first transmitting means comprises a microstrip (MS) transmission line.

* * * * *